US010312850B2

(12) United States Patent
Tsubota

(10) Patent No.: US 10,312,850 B2
(45) Date of Patent: Jun. 4, 2019

(54) SEMICONDUCTOR DEVICE AND POWER CONVERSION DEVICE

(71) Applicant: Renesas Electronics Corporation, Tokyo (JP)

(72) Inventor: Masashi Tsubota, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/814,213

(22) Filed: Nov. 15, 2017

(65) Prior Publication Data

US 2018/0183378 A1 Jun. 28, 2018

(30) Foreign Application Priority Data

Dec. 28, 2016 (JP) ................................. 2016-255581

(51) Int. Cl.
| | | |
|---|---|---|
| *H02P 27/08* | (2006.01) | |
| *H02M 1/42* | (2007.01) | |
| *H02P 29/40* | (2016.01) | |
| *H02M 1/08* | (2006.01) | |
| *H02M 3/158* | (2006.01) | |

(Continued)

(52) U.S. Cl.
CPC ............ *H02P 27/085* (2013.01); *H02M 1/08* (2013.01); *H02M 1/4216* (2013.01); *H02M 3/158* (2013.01); *H02M 7/5395* (2013.01); *H02P 6/085* (2013.01); *H02P 27/08* (2013.01); *H02P 27/10* (2013.01); *H02P 29/40* (2016.02); *H02P 29/50* (2016.02); *H01L 2224/05554* (2013.01); *H01L 2924/14* (2013.01);
(Continued)

(58) Field of Classification Search
CPC .. H02P 21/22; H02P 6/08; H02P 21/24; H02P 27/08; H02P 27/085; H02P 9/30; H02P 2209/09; H02P 29/40; H02P 6/085; H02M 1/08; H02M 1/4216; H02M 3/158; H02M 7/5395
See application file for complete search history.

(56) References Cited

U.S. PATENT DOCUMENTS

| | | | | |
|---|---|---|---|---|
| 9,270,220 | B2 * | 2/2016 | Magee | ...................... H02P 6/18 |
| 2008/0048598 | A1 * | 2/2008 | Shibuya | .................. H02P 6/185 |
| | | | | 318/400.1 |

(Continued)

FOREIGN PATENT DOCUMENTS

JP 2015-053824 A 3/2015

OTHER PUBLICATIONS

Extended European Search Report dated Jun. 1, 2018 in corresponding European Application No. 17208363.6.

Primary Examiner — Thai T Dinh
(74) Attorney, Agent, or Firm — McGinn IP Law Group, PLLC

(57) ABSTRACT

To solve the problem of multi-pulse control in which the load of the control software is increased and further switching/timing adjustment is required, a semiconductor device includes a control unit including a CPU and a memory, a PWM output circuit for controlling the driver IC to drive the power semiconductor device, a current detection circuit for detecting the motor current, and an angle detection circuit for detecting the angle of the motor. The PWM output circuit includes a square wave generator circuit to generate a square wave based on the angle of the angle detection circuit as well as the base square wave information.

15 Claims, 17 Drawing Sheets

(51) Int. Cl.
*H02P 29/50* (2016.01)
*H02P 6/08* (2016.01)
*H02M 7/5395* (2006.01)
*H02P 27/10* (2006.01)
*H02M 1/00* (2006.01)

(52) U.S. Cl.
CPC ............... *H02M 2001/0009* (2013.01); *H02M 2001/0032* (2013.01); *H02P 2209/09* (2013.01)

(56) References Cited

U.S. PATENT DOCUMENTS

| | | | |
|---|---|---|---|
| 2008/0211450 A1* | 9/2008 | Yamada | H02P 23/0027 318/801 |
| 2011/0266992 A1* | 11/2011 | Nishiguchi | B60L 11/123 318/807 |
| 2012/0176071 A1* | 7/2012 | Manabe | H02P 6/085 318/400.14 |
| 2014/0152205 A1* | 6/2014 | Nakai | H02P 21/05 318/400.02 |
| 2015/0054432 A1* | 2/2015 | Omata | H02P 21/14 318/400.02 |
| 2015/0054438 A1* | 2/2015 | Omata | H02P 21/20 318/400.13 |
| 2016/0308475 A1* | 10/2016 | Morii | H02P 21/02 |

* cited by examiner

SEMICONDUCTOR DEVICE AND POWER CONVERSION DEVICE

CROSS-REFERENCE TO RELATED APPLICATIONS

The disclosure of Japanese Patent Application No. 2016-255581 filed on Dec. 28, 2016 including the specification, drawings and abstract is incorporated herein by reference in its entirety.

BACKGROUND

The present disclosure relates to a semiconductor device and is applicable, for example, to a semiconductor device that generates a multi-pulse square wave for a power conversion device.

AC electric motor driven by a power conversion device is applied to various products such as electric vehicles and hybrid electric vehicles. In general, the AC electric motor can be driven at a variable speed by using a power conversion device for converting AC power to an arbitrary frequency and voltage. The power conversion device is configured with a main circuit using a semiconductor switching element such as IGBT, as well as a control circuit for controlling the semiconductor switching element. The power conversion device drives the motor at a variable speed by performing pulse width modulation control (hereinafter, referred to as "PWM control") on the semiconductor switching element with an arbitrary carrier frequency to control the voltage and frequency applied to the AC electric motor. In the modulation of the power conversion device, the output voltage is adjusted by the pulse width modulation control. Thus, it has been proposed to use multi-pulse mode in which a half cycle of the output voltage with a plurality of voltage pulses and to use one pulse mode in which a half cycle of the output voltage is configured with a single pulse (for example, Patent Document 1: Japanese Unexamined Patent Application Publication No. 2015-53824)

SUMMARY

Motor control controls the amount of current by varying the output duty of the PWM control, so that dead time is required for switching the output pulse and results in a loss. The switching loss can be reduced to nearly zero by controlling the motor by a square wave, such as one pulse, in the high rotation region of the motor. In this case, however, the current waveform may not become a sine wave corresponding to the angle due to the influence of the inductance of the motor, or the like, and efficiency may be reduced. Multi-pulse control is known as one of the methods for preventing the reduction in efficiency by the control so that the switching loss is reduced and the current waveform becomes a sine wave according to the angle in the high rotation region of the motor. However, the multi-pulse control leads to an increase in the load of the control software.

Other objects and novel features will become apparent from the description of the present specification and the accompanying drawings.

A typical configuration of the present invention will be briefly described below.

In other words, a semiconductor device includes a PWM output circuit, a current detection circuit that detects the current of a motor, and an angle detection circuit that detects the angle of the motor. The PWM output circuit includes a square wave generator circuit. The square wave generator circuit generates a square wave based on the angle information of the angle detection circuit as well as the base square wave information.

According to the semiconductor device described above, it is possible to reduce the load of the control software.

DETAILED DESCRIPTION

Figure 1:
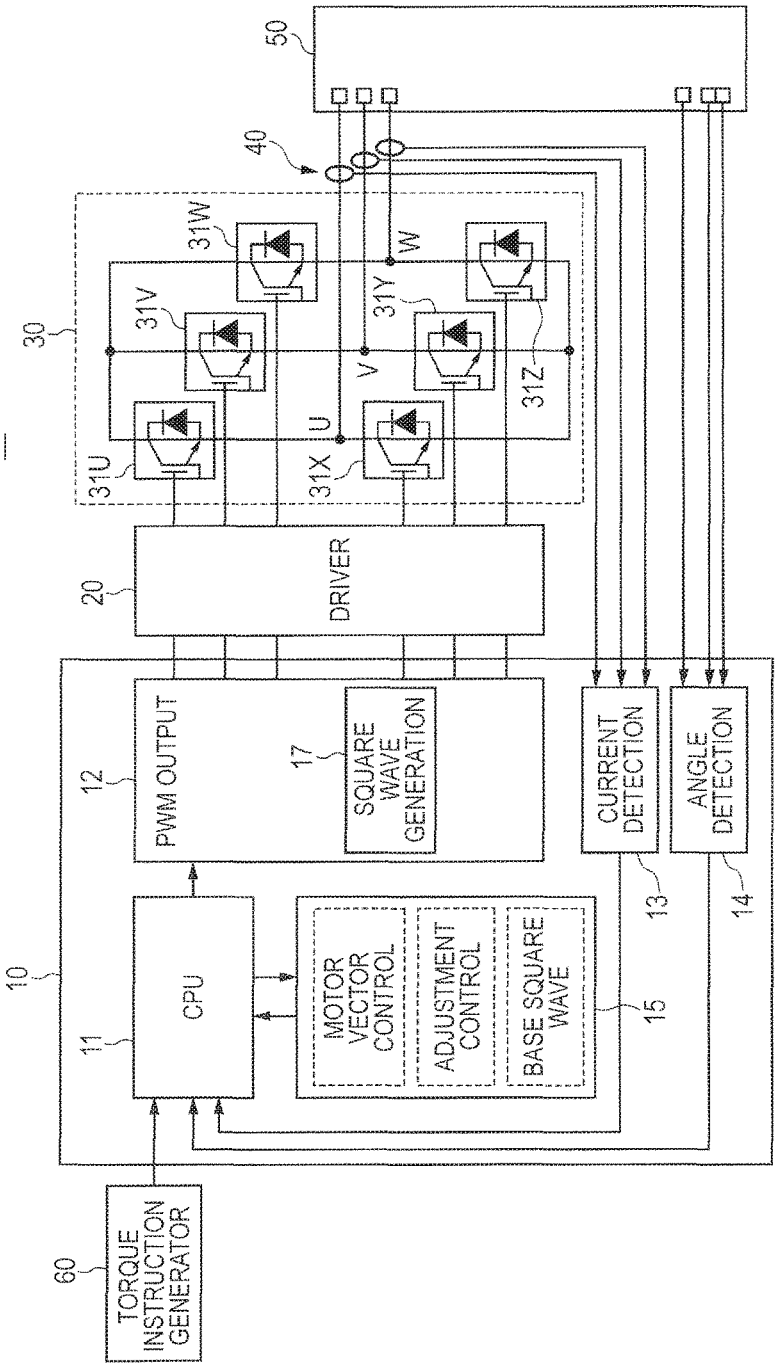
FIG. 1 is a block diagram showing the configuration of an electric motor system according to an embodiment.

Hereinafter, comparative example, embodiment, examples, and variations will be described with reference to the accompanying drawings. Note, however, that in the following description, the same components are denoted by the same reference numerals and the redundant description thereof may be omitted.

Figure 2:
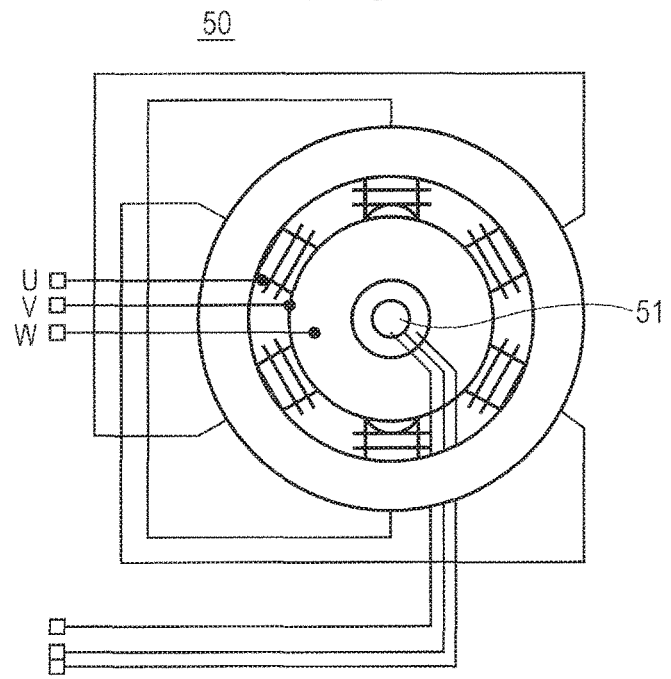
FIG. 2 is a diagram showing a motor in FIG. 1 as well as an angle sensor.
Figure 3:
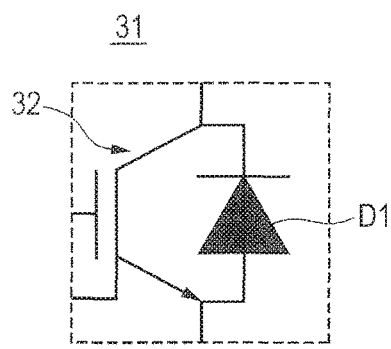
FIG. 3 is a diagram showing a power semiconductor device in FIG. 1.

First, an electric motor system will be described with reference to FIGS. 1 and 2. FIG. 1 is a block diagram showing the configuration of an electric motor system according to an embodiment. FIG. 2 is a diagram showing a three-phase motor. FIG. 3 is a circuit diagram of a power semiconductor device.

An electric motor system 1 includes a three-phase motor 50 which is an electric motor, an inverter circuit 30 using six power semiconductor devices, a driver IC 20, a control circuit 10, a torque instruction generator 60, a current detector 40 such as a current transformer, and a DC source (not shown). The inverter circuit 30 is also referred to as the power module. The inverter circuit 30 controls the ON/OFF of a switching transistor 32 within the inverter circuit 30 to allow the current to flow through each phase of the three-phase motor 50. In this way, the inverter circuit 30 changes the speed of a vehicle or the like by the frequency of the switching. Further, when braking the vehicle or the like, the inverter circuit 30 regenerates the input signal by controlling the ON/OFF of the switching transistor 32 in synchronization with the voltage generated in each phase of the three-phase motor 50, or performing a so-called rectification operation, in order to convert the input signal to a DC voltage.

The three-phase motor 50 has a rotor which is a permanent magnet, and an armature which is configured by coils in which the armature windings of three phases (U phase, V phase, and W phase) are arranged at intervals of 120 degrees. The coils are connected in Delta so that the current constantly flows through the three coils of U phase, V phase, and W phase. The three-phase motor 50 includes an angle detector 51 such as a resolver.

The inverter circuit 30 configures bridge circuits of U phase, V phase, and W phase by power semiconductor devices. The U-phase bridge is coupled to the three-phase motor 50 at the connection point between a power semiconductor device 31U and a power semiconductor device 31X. The V-phase bridge circuit is coupled to the three-phase motor 50 at the connection point between a power semiconductor device 31V and a power semiconductor device 31Y. The W-phase bridge circuit is coupled to the three-phase motor 50 at the connection point between a power semiconductor device 31W and a power semiconductor device 31Z. Here, the power semiconductor devices 31U, 31V, 31W, 31X, 31Y, and 31Z have the same configuration, so that they may sometimes be collectively referred to as power semiconductor device 31. As shown in FIG. 3, the power semiconductor device 31 is configured with a semiconductor chip including a switching transistor 32 of an IGBT (hereinafter referred to as IGBT), as well as a semiconductor chip including a freewheeling diode (FWD) D1 that is coupled in parallel between the IGBT 32 and a collector. The freewheeling diode D1 is coupled in such a way that the current flows in the direction opposite to the current flowing through the IGBT 32. It is preferred that the semiconductor chip in which the IGBT 32 and a temperature detection diode (not shown) are formed, and the semiconductor chip in which the freewheeling diode D1 is formed are encapsulated into the same package. The freewheeling diode D1 can be formed in the same chip as the semiconductor chip in which the IGBT 32 is formed.

The driver IC 20, which is a first semiconductor device, includes a drive circuit (not shown) that generates a signal to drive the gate of the IGBT 32, an excess current detection circuit (not shown), and a temperature detection circuit (not shown) in a single semiconductor substrate.

The control circuit 10, which is a second semiconductor device, includes a CPU 11, a PWM output circuit 12, a current detection circuit 13, an angle detection circuit 14, and a memory 15 in a single semiconductor substrate (semiconductor chip). The CPU 11 performs motor vector control and adjustment control based on the software stored in the memory 15. The current detection circuit 13 includes, for example, an analog/digital (A/D) conversion circuit. The angle detection circuit 14 includes a resolver/digital (R/D) conversion circuit that detects a signal from the angle detector 51 of the three-phase motor 50. The PWM output circuit 12 includes a square wave generator circuit 17 that generates a signal to control the drive circuit of the driver IC 20. The memory 15 stores the base square wave information described below, in addition to the software described above. The memory 15 is a non-volatile memory such as a flash memory. The software for the motor vector control and adjustment control, and the base square wave data can be stored separately in different non-volatile memories.

The torque instruction generator 60, which is located before the control circuit 10, generates a torque instruction to the three-phase motor 50. The control circuit 10 controls the torque generated by the three-phase motor 50 through the inverter circuit 30 based on the torque instruction from the torque instruction generator 60.

The motor vector control is also referred to as field oriented control (FOC), which models the AC electric motor as an equivalent DC motor by a transformation from the stationary reference frame to the rotating reference frame. The rotating reference frame is a frame of reference that mathematically corresponds to the intuitive relationship between the AC electric motor and the DC motor. The stationary reference frame and the rotating reference frame can be transformed to each other by using the mathematical transformation. This transformation can be used to simplify the modeling of the AC electric motor. The forward park transformation, which is one of the mathematical transformations, gives the magnetic flux to be generated by the armature which is the stator of the AC electric motor, as the function of the rotation angle of the rotor. The inverse park transformation, which is a second mathematical transformation, obtains the magnetic flux vector of the rotor of the rotating reference frame from the magnetic flux of the stator in the stationary reference frame. By using these two transformations, it is possible to convert the current and voltage related to the stator, which is the armature of the AC electric motor, into the current and voltage related to the rotor which is the armature of the DC motor. In other words, this makes it possible to easily generate the control model of the AC electric motor. Further, the Clarke transformation synthesizes the magnetic flux of each of the coils of three phases, and expresses the result as the component orthogonal to the X axis and the Y axis. In this way, it is possible to reduce the calculation process required to control the three-phase AC electric motor to the calculation process corresponding to the two-phase AC electric motor. The CPU 11 and the memory 15 are referred to as a control unit. The function that performs the motor vector control by the CPU 11 is referred to as a motor vector control unit, and the function that performs the adjustment control described below is referred to as an adjustment control unit. Note that a part of the motor vector control unit can be achieved by a dedicated processor, such as DSP, or by dedicated hardware.

Figure 4:
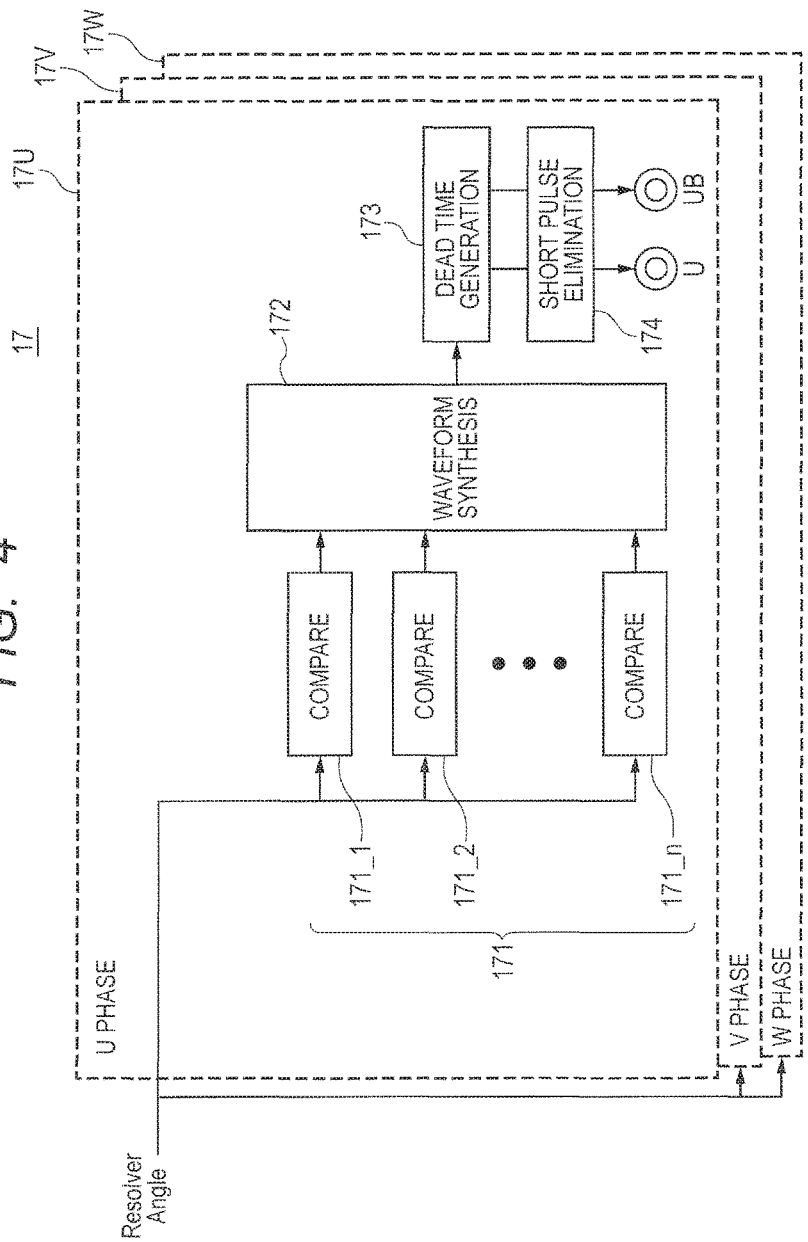
FIG. 4 is a block diagram of a square wave generation unit in FIG. 1.
Figure 5:
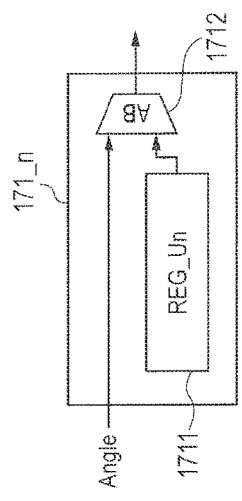
FIG. 5 is a block diagram of a compare in FIG. 4.
Figure 6:
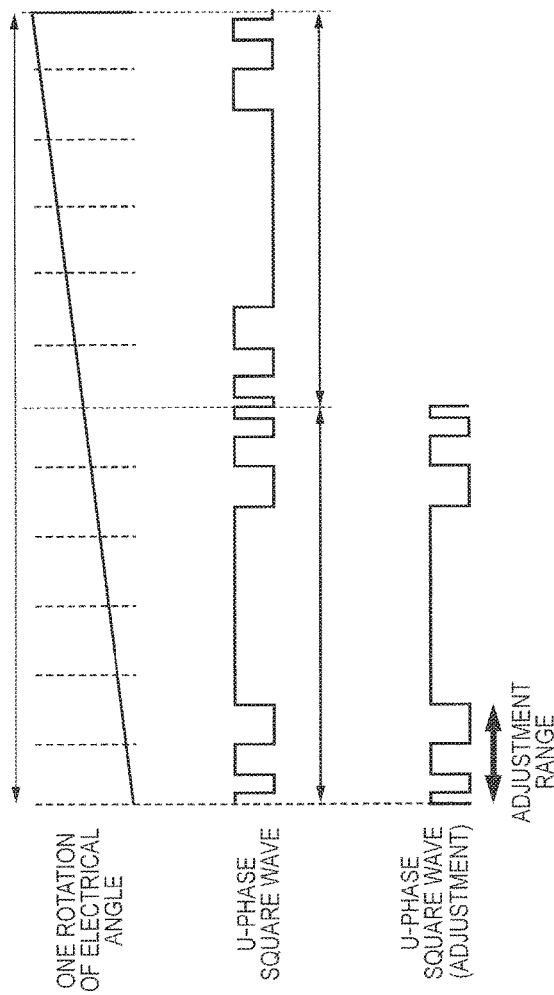
FIG. 6 is an image diagram for explaining an output example of a rectangular pulse.

Next, the square wave generator circuit of FIG. 1 will be described with reference to FIGS. 4 to 6. FIG. 4 is a block diagram showing the square wave circuit of FIG. 1. FIG. 5 is a block diagram showing the compare circuit of FIG. 4. FIG. 6 is an image diagram for explaining an output example of a square wave pulse.

The square wave generator circuit 17 includes a U-phase square wave generator circuit 17U, a V-phase square wave generator circuit 17V, and a W-phase square wave generator circuit 17W. The U-phase square wave generator circuit 17U includes a compare circuit 171, a waveform synthesis circuit 172, a dead time generator circuit 173, and a short pulse removing circuit 174. The compare circuit 171 includes a first compare circuit 171_1, a second compare circuit 171_2, . . . , and an n-th compare circuit 171_n. The first compare circuit 171_1, the second compare circuit 171_2, . . . , and the n-th compare circuit 171_n have the same configuration. Thus, the n-th compare circuit 171_n is described as representative of these compare circuits.

The n-th compare circuit 171_n includes an n-th register (REG_Un) 1711_n for storing the angle as well as an n-th comparator 1712_n. The n-th register 1711_n is a register readable and writable by the CPU 11. The n-th compare circuit 171_n detects matching between the angle stored in the n-th register 1711_n and the angle detected by the angle detection circuit 14. The n-th compare circuit 171_n can detect the fact that the angle from the angle detection circuit 14 exceeds the angle stored in the n-th register 1711_n.

The wave synthesis circuit 172 generates a square wave by outputting High when the first compare circuit 171_1 detects matching, outputting Low when the second compare circuit 171_2 detects matching, outputting High when the n-th compare circuit 171_n detects matching, and so on. The wave synthesis circuit 172 can generate various types of square waves by changing the values of the first register, the second register, . . . , and the n-th register.

The dead time generator circuit 173 generates a square wave by reversing the square wave generated by the wave synthesis circuit 172. Then, the dead time generator circuit 173 further provides a dead time so that the High periods of the square waves do not overlap each other. When the period in which a square wave is high is shorter than a predetermined period, the short pulse removing circuit 174 removes the pulse of the square wave. The U-phase square wave and the U-phase reversed square wave are generated by the processes described above.

The square wave generator circuit 17 generates a square wave by performing magnitude comparison on the angle information within the register based on the angle information of the motor as well as the base square wave data, constantly, during the operation. As shown in FIG. 6, for example, the U-phase square wave is output for 5 pluses in a half rotation of the electrical angle. With respect to the U-phase square wave in the second half rotation of the electrical angle, a waveform obtained by reversing the U-phase square wave is output in the first half rotation of the electrical angle. The adjustment, which is described below, adjusts the phase and duty in a predetermined angle range (for example, 30 degrees).

The V-phase square wave generator circuit 17V and the W-phase square wave generator circuit 17W have the same configuration as the U-phase square wave generator circuit 17U, but their square waves are generated so as to be shifted by 120 degrees with respect to each other.

Figure 7:
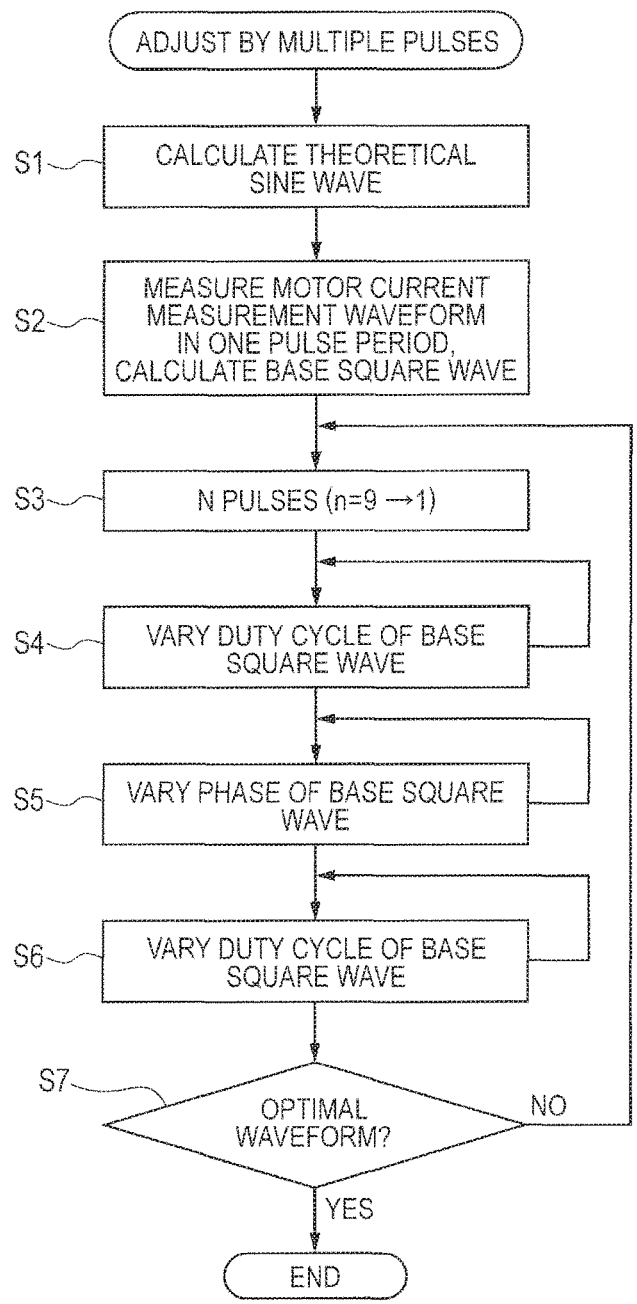
FIG. 7 is a flow chart of adjustment.
Figure 8:
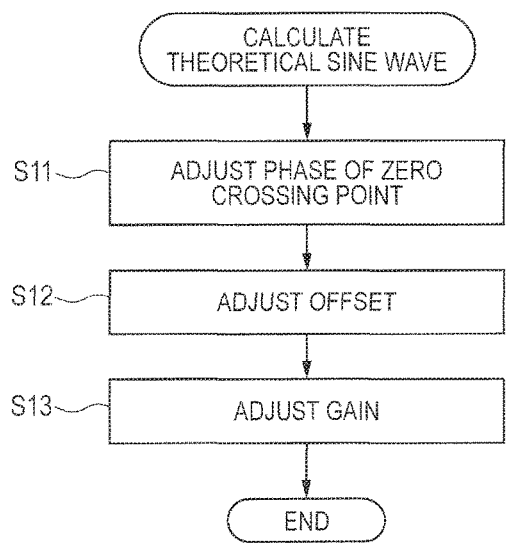
FIG. 8 is a flow chart of calculation of theoretical sine wave.
Figure 9:
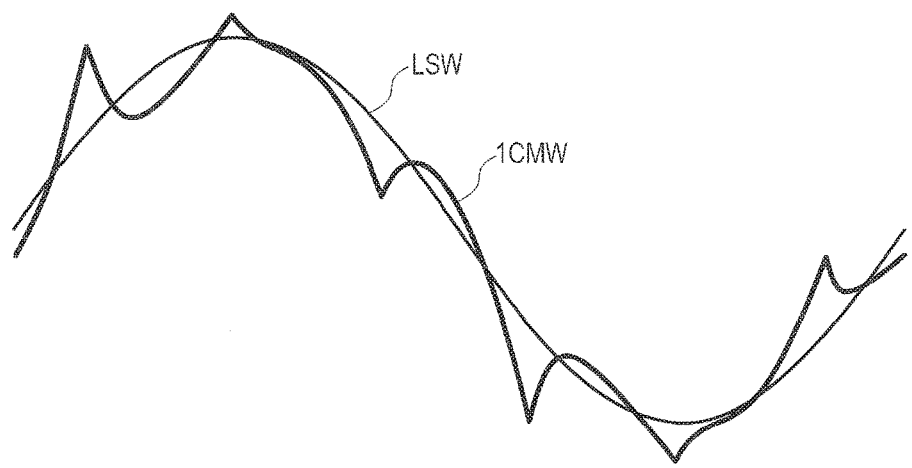
FIG. 9 is a diagram showing a motor current measurement waveform of one pulse.
Figure 10:
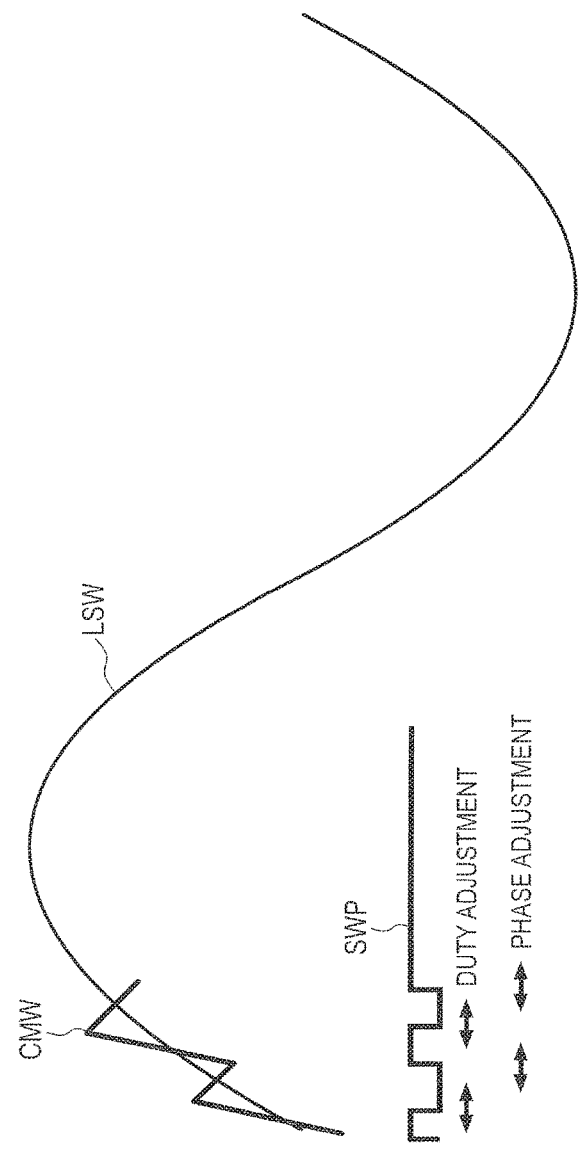
FIG. 10 is a diagram showing a method of adjusting the square wave.

Next, a method of adjusting the square wave will be described with reference to FIGS. 7 to 10. FIG. 7 is a flow chart showing a method of adjusting the square wave by multiple pulses. FIG. 8 is a flow chart of calculation of theoretical sine wave. FIG. 9 is a diagram showing a motor current measurement waveform of one pulse. FIG. 10 is a diagram for explaining a method of adjusting the square wave. Note that the waveform for one electrical angle is shown in FIGS. 9 and 10.

The adjustment control unit adjusts the square wave by driving the motor in such a way that the motor current measurement waveform approximates the sine wave (theoretical sine wave).

Step S1: As shown in FIG. 8, the adjustment control unit calculates a theoretical sine wave in the following steps.

Step S11: Generate a deviation table between the motor current measurement waveform and the sine wave per rotation at a constant rotation, to perform phase adjustment on the zero-crossing point Step S12: Perform offset adjustment Step S13: Perform gain adjustment (that adjusts the gain of the sine wave so that the sum is 0) to calculate the sine wave.

Step S2: As shown in FIG. 9, the adjustment control unit measures the motor current measurement waveform (1 CMW) during the period of one pulse, and calculates the base square wave from the deviation between the motor current measurement waveform and the theoretical sine wave (LSW).

Step S3: The adjustment control unit performs the adjustment by first controlling with the base square wave pulse, measuring the motor current at one rotation of the motor with a sufficiently short cycle, and calculating the difference from the theoretical sine wave. Further, the adjustment is performed by searching conditions in which the square wave is similar to the theoretical sine wave and the number of pulses is small, by varying the number of pulses. For example, there are 9 pulses, 7 pulses, 5 pulses, 3 pulses, and 1 pulse, or the like. In FIG. 7, n of n pulses is between 9 and 1, but is not limited thereto.

Step S4: The adjustment control unit adjusts the duty cycle of the square wave pulse (SWP) so as to minimize the deviation between the current measurement waveform (CMW) and the theoretical sine wave (LSW) as shown in FIG. 10, by changing the value of the register of the compare circuit 171. The adjustment is performed so as to minimize the deviation by varying the duty close to the point at which the deviation is large. Note that this step is not necessarily required.

Step S5: The adjustment control unit adjusts the phase of the square wave pulse (SWP) so as to minimize the deviation between the current measurement waveform (CMW) and the theoretical sine wave (LSW) as shown in FIG. 10, by changing the value of the register of the compare circuit 171. The adjustment is performed so as to minimize the deviation by varying the phase close to the point at which the deviation is large.

Step S6: The adjustment control unit adjusts the duty cycle of the square wave pulse (SWP) so as to minimize the deviation between the current measurement waveform (CMW) and the theoretical sine wave (LSW) as shown in FIG. 10, by changing the value of the register of the compare circuit 171.

Step S7: The adjustment control unit determines whether the square wave pulse is an optimal waveform. If YES, the adjustment control unit stores the set value of the register of the compared circuit 171 corresponding to the optimal waveform as base square wave information into the memory 15, and ends the process. If NO, the adjustment control unit returns to Step S3.

These adjustments are performed when the three-phase motor 50 and the inverter circuit 30 are incorporated into the system 1. However, the adjustments can also be performed during the operation according to the load state and the temperature dependence. During the operation, the square wave generator circuit generates the square wave by setting the data of the base square wave information of the memory 15 into the register of the compare circuit 171.

Figure 11:
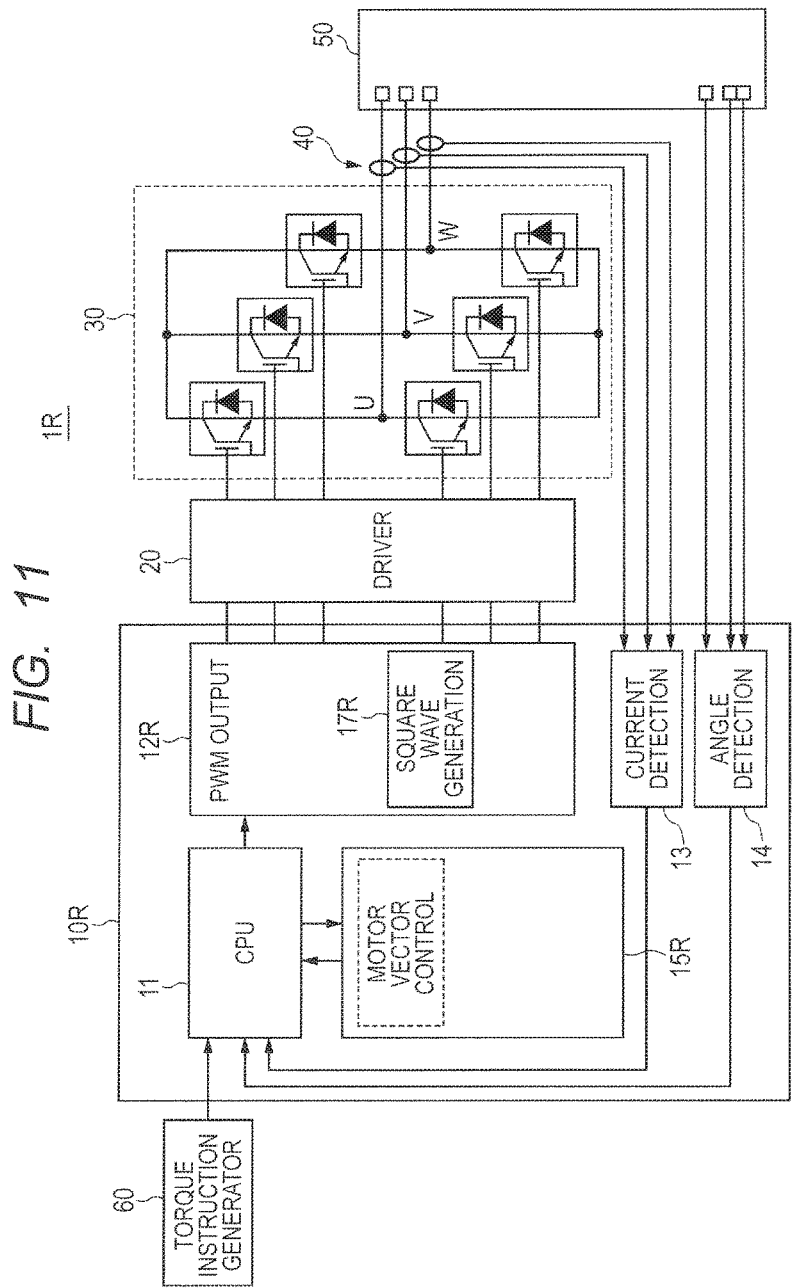
FIG. 11 is a block diagram showing the configuration of an electric motor system according to a comparative example.

Next, an electric motor system according to the technique (comparative example) studied by the inventors will be described with reference to FIG. 11. FIG. 11 is a block diagram showing the configuration of an electric motor system according to a comparative example.

An electric motor system 1R includes a three-phase motor 50, an inverter circuit 30 using six power semiconductor devices, a driver IC 20, a control circuit 10R, a torque instruction generator 60, and a DC power supply (not shown). The control circuit 10R includes a CPU 11, a PWM output circuit 12R, a current detection circuit 13, an angle detection circuit 14, and a memory 15 in a single semiconductor substrate. The CPU 11 performs motor vector control based on the software stored in the memory 15. The PWM output circuit 12R includes a square wave generator circuit 17R that generates a signal to control the drive circuit of the driver IC 20.

Figure 12:
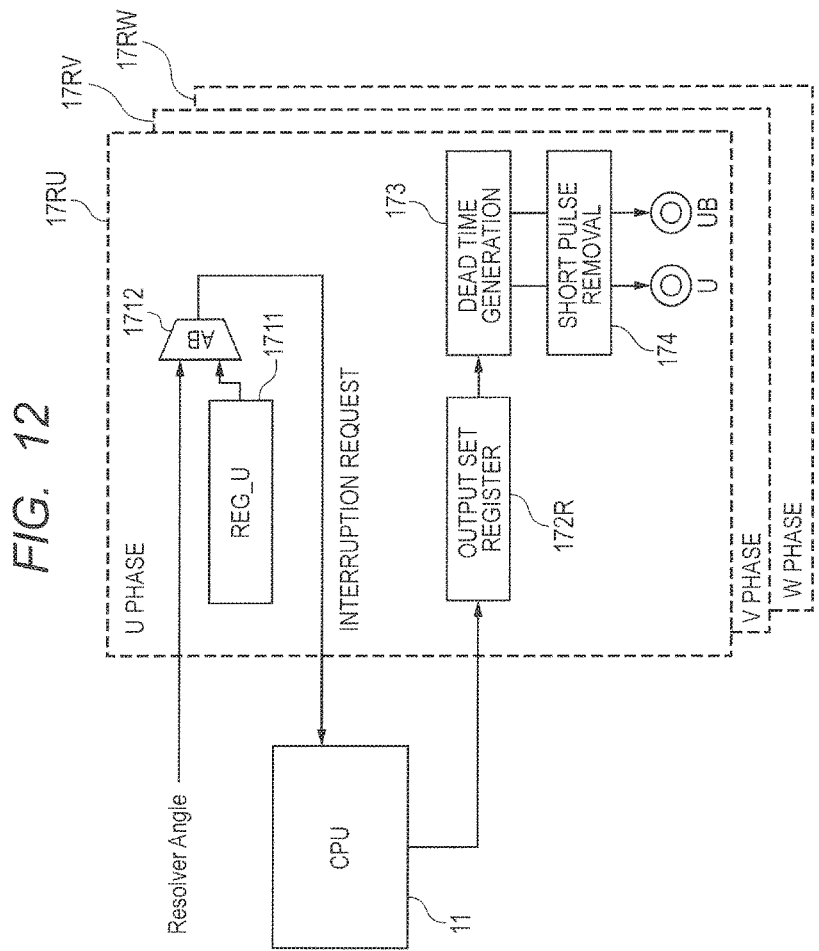
FIG. 12 is a block diagram of a square wave generation unit in FIG. 10.

Next, the square generator circuit according to the comparative example will be described with reference to FIG. 12. FIG. 12 is a block diagram showing the square wave generator circuit in FIG. 11.

The square wave generator circuit 17R includes a U-phase square wave generator circuit 17RU, a V-phase square wave generator circuit 17RV, and a W-phase square wave generator circuit 17RW. The U-phase square wave generator circuit 17RU includes a register (REG_Un) 1711 that stores the angle, a comparator 1712, an output set register 172R, a dead time generator circuit 173, and a short pulse removing circuit 174. The register 1711 and the output set register 172R are registers readable and writable by the CPU 11. The comparator 1712 detects matching between the angle stored in the register (REG_Un) 1711 and the angle detected by the angle detection circuit 14.

When the square wave generator circuit 17R outputs an interruption request upon detection of matching by the comparator 1712, High or Low is set in the output set register by the interruption processing routine of the CPU 11, and thus a square wave is generated. Various types of square waves can be generated by changing the values of the register 1711 and the output set register 172R. However, the load on the CPU 11 (the load on the control software) is large because it is necessary to perform processing such as calculation, setting, and interruption to obtain the set values of the register 1711 and the output set register 172R.

The V-phase square wave generator circuit 17RV and the W-phase square wave generator circuit 17RW have the same configuration as the U-phase square wave generator circuit 17RU, but their square waves are generated so as to be shifted by 120 degrees with respect to each other.

First Variation

Figure 13:
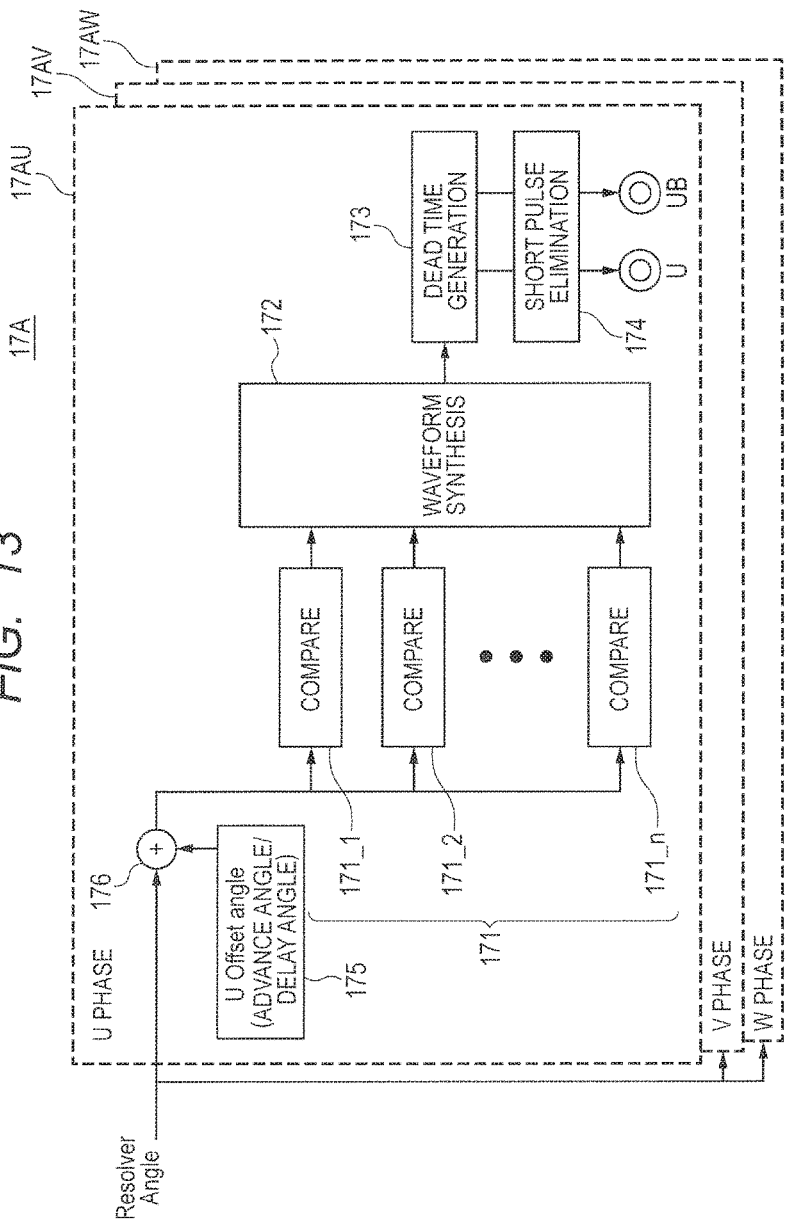
FIG. 13 is a block diagram of a square wave generation unit according to a first variation.
Figure 14:
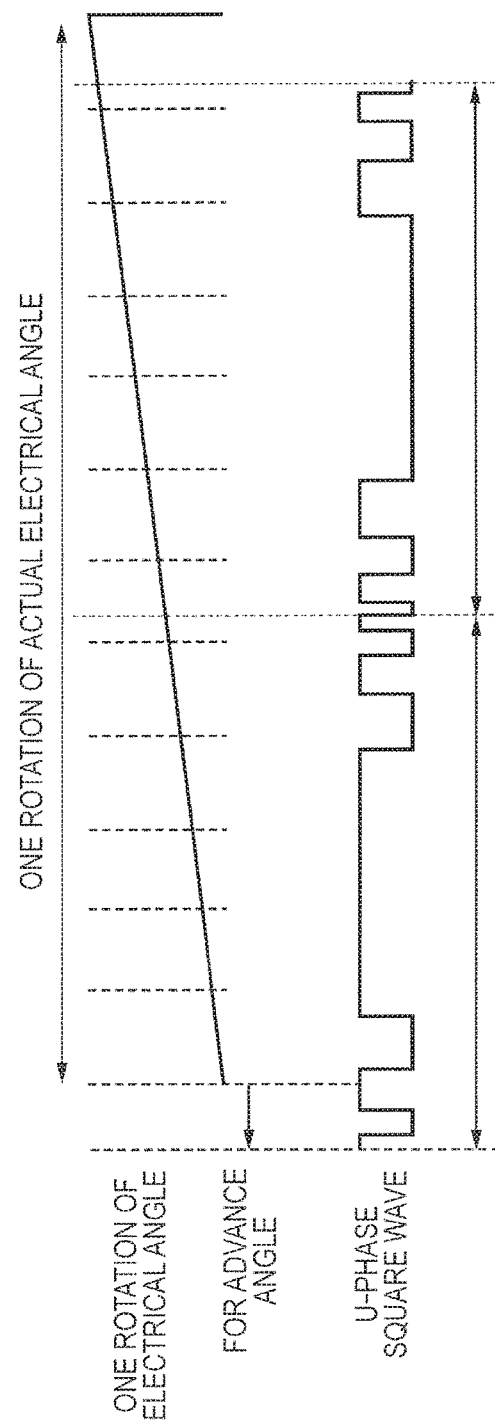
FIG. 14 is an image diagram for explaining an output example of a square wave pulse.

Next, a square wave generator circuit according to a first variation will be described with reference to FIGS. 13 and 14. FIG. 13 is a block diagram showing the square wave generator circuit according to the first variation. FIG. 14 is an image diagram for explaining an output example of a square wave pulse. The square wave generator circuit according to the first variation is configured such that a function to control the advance angle/delay angle for each phase is added to the square wave generator circuit according to the embodiment.

The square wave generator circuit 17A includes a U-phase square wave generator circuit 17AU, a V-phase square generator circuit 17AV, and a W-phase square wave generator circuit 17AW. The U-phase square wave generator circuit 17AU includes a compare circuit 171, a waveform synthesis circuit 172, a dead time generator circuit 173, a short pulse removing circuit 174, a register 175 for controlling the advance angle/delay angle for each phase, and an adder 176 for adding the contents of the register to the angle of the resolver. The register is a register readable and writable by the CPU 11.

As shown in FIG. 14, when the register 175 sets an advance angle, the U-phase square wave is output faster than one rotation of the actual electrical angle. The advance angle and delay angle control is performed, for example, for every 30 degrees or at a frequency of several 100 ns.

The V-phase square wave generator circuit 17AV and the W-phase square wave generator circuit 17AW have the same configuration as the U-phase square wave generator circuit 17AU, but their square waves are generated so as to be shifted by 120 degrees with respect to each other.

Second Variation

Figure 15:
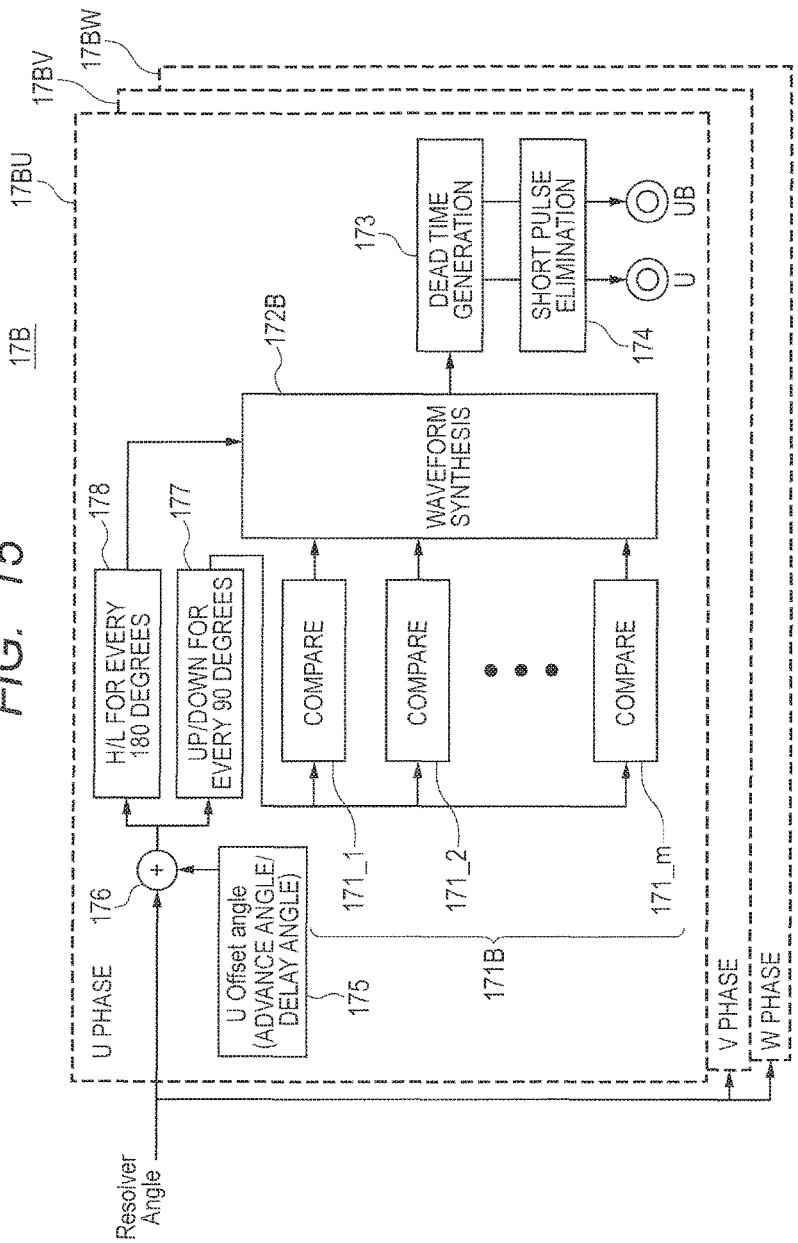
FIG. 15 is a block diagram of a square wave generation unit according to a second variation.
Figure 16:
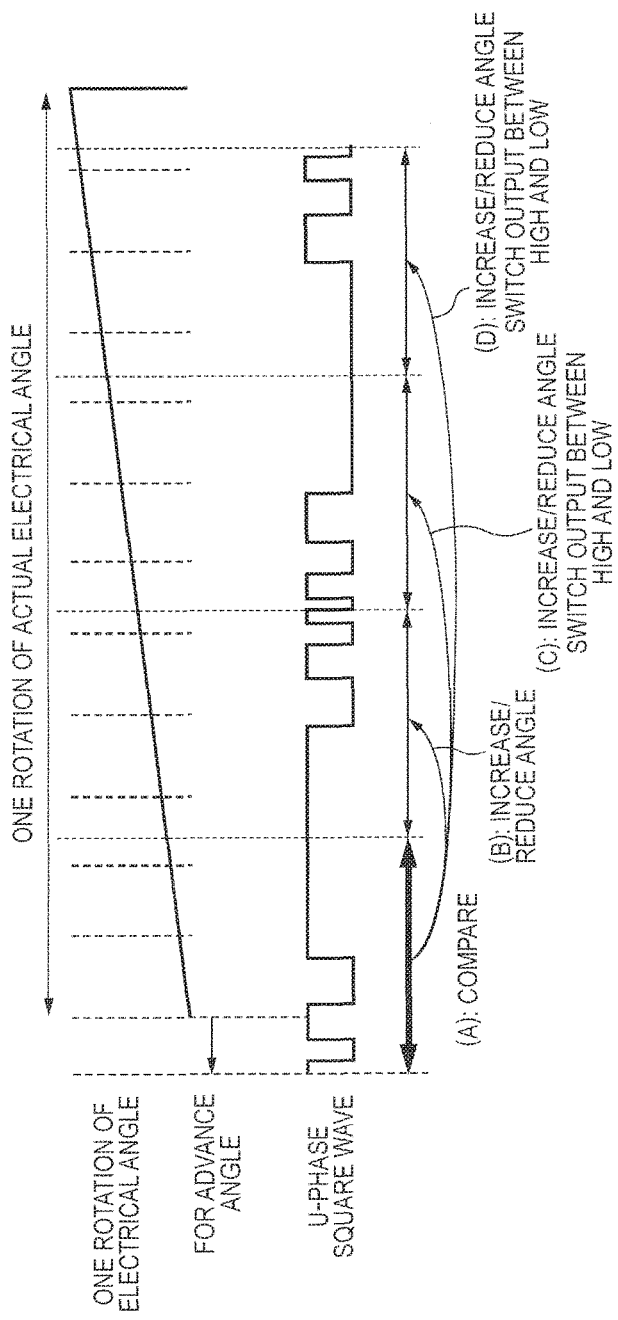
FIG. 16 is an image diagram for explaining an output example of a square wave pulse.

Next, a square wave generator circuit according to a second variation will be described with reference to FIGS. 15 and 16. FIG. 15 is a block diagram showing the square wave generator circuit according to the second variation. FIG. 16 is an image diagram for explaining an output example of a square wave pulse. The square wave generator circuit according to the second variation is configured such that a function to shift by 90 and 180 degrees of the sine wave is added to the square wave generator circuit according to the first variation.

The square wave generator circuit 17B includes a U-phase square wave generator circuit 17BU, a V-phase square wave generator circuit 17BV, and a W-phase square wave generator circuit 17BW. The U-phase square wave generator circuit 17BU includes a compare circuit 171B, a waveform synthesis circuit 172B, a dead time generator circuit 173, a short pulse removing circuit 174, a register 175 for controlling the advance angle/delay angle for each phase, an adder 176 for adding the contents of the register to the angle of the resolver, a circuit 177 for increasing and reducing the angle for every 90 degrees, and a circuit 178 for switching between High and Low for every 180 degrees. The compare circuit 171B includes a first compare circuit 171_1, a second compare circuit 171_2, . . . , and an m compare circuit 171_m. Note that m is smaller than n, so that the number of compare circuits of the compare circuit 171B is smaller than the number of compare circuits of the compare circuit 171.

As shown in FIG. 16, the compare circuit 171B only compares 0 to 90 degrees corresponding to the sine wave (A). The circuit 177 increases and reduces the angle value to be compared for every 90 degrees (B, C, D). The circuit 178 switches between High and Low of the output for every 180 degrees (C, D). By these processes, it is possible to automatically generate the remaining 90 to 360 degrees, thereby reducing the size of the compare circuit 171B and the waveform synthesis circuit 172B.

The V-phase square wave generator circuit 17AV and the W-phase square wave generator circuit 17AW have the same configuration as the U-phase square wave generator circuit 17AU, but their square waves are generated so as to be shifted by 120 degrees with respect to each other.

In the second variation, similarly to the embodiment, the register 175 for controlling the advance angle/delay angle for each phase, as well as the adder 176 for adding the contents of the register to the angle of the resolver are not necessarily required.

Third Variation

Figure 17:
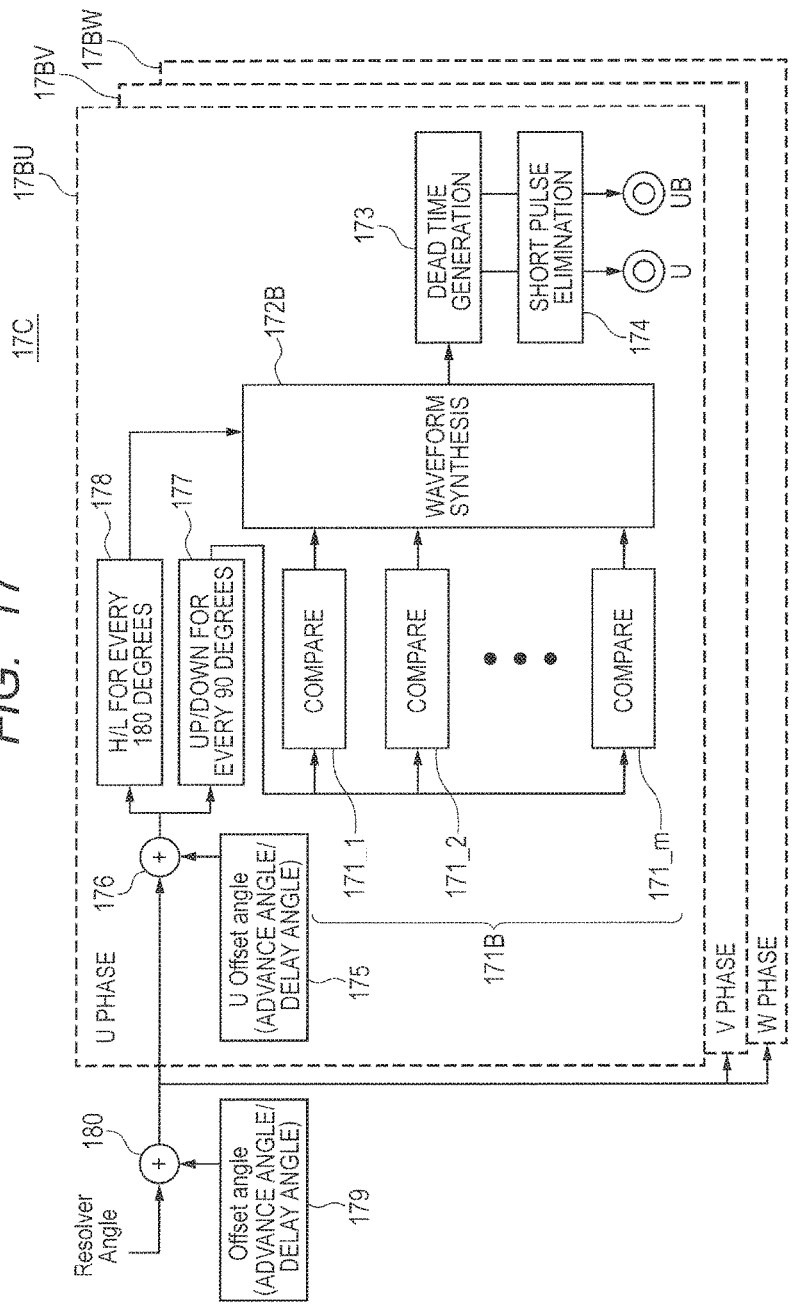
FIG. 17 is a block diagram of a square wave generation unit according to a third variation.
Figure 18:
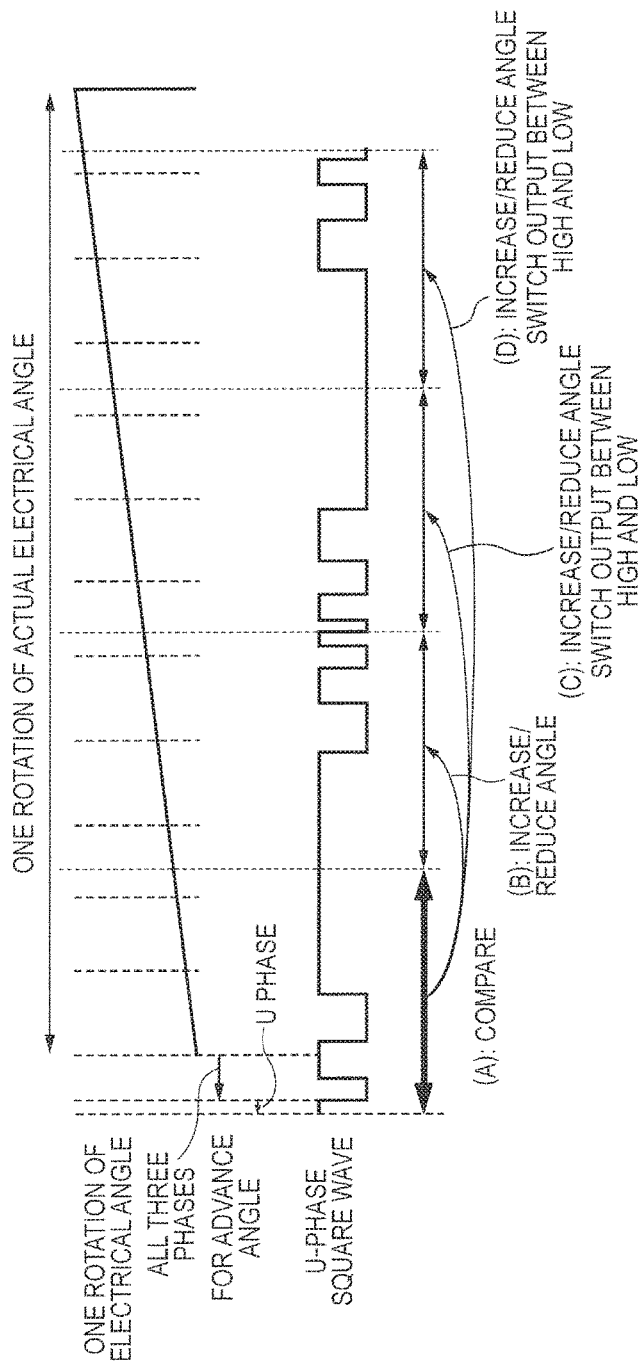
FIG. 18 is an image diagram for explaining an output example of a square wave pulse.

Next, a square wave generator circuit according to a third variation will be described with reference to FIGS. 17 and 18. FIG. 17 is a block diagram showing the square wave generator circuit according to the third variation. FIG. 18 is an image diagram for explaining an output example of a square wave pulse. The square wave generator circuit according to the third variation is configured such that a function to control the advance angle/delay angle with respect to all the three phases is added to the square wave generator circuit according to the second variation.

A square wave generator circuit 17C includes a U-phase square wave generator circuit 17BU, a V-phase square wave generator circuit 17BV, a W-phase square wave generator circuit 17BW, a register 179 for controlling the advance angle/delay angle with respect to all the three phases, and an adder 180 for adding the contents of the register to the angle of the resolver. It is possible to change the whole three phases in the phase direction with an arbitrary timing in order to control the advance angle/delay angle. The register 179 is a register readable and writable by the CPU 11.

As shown in FIG. 18, when advance angle is set in the register 179, the U-phase square wave, the V-phase square wave, and the W-phase square wave are output faster than one rotation of the actual electrical angle. Further, the U-phase square wave is output even faster when advance angle is set in the register 175. The advance angle/delay angle control is performed, for example, for every 30 degrees or at a frequency of several 100 ns.

In the third variation, similarly to the embodiment, the register 175 for controlling the advance angle/delay angle for each phase, as well as the adder 176 for adding the contents of the register to the angle of the resolver are not necessarily required. In addition, the function to shift by 90 and 180 degrees of the sine wave is not necessarily required.

Fourth Variation

Figure 19:
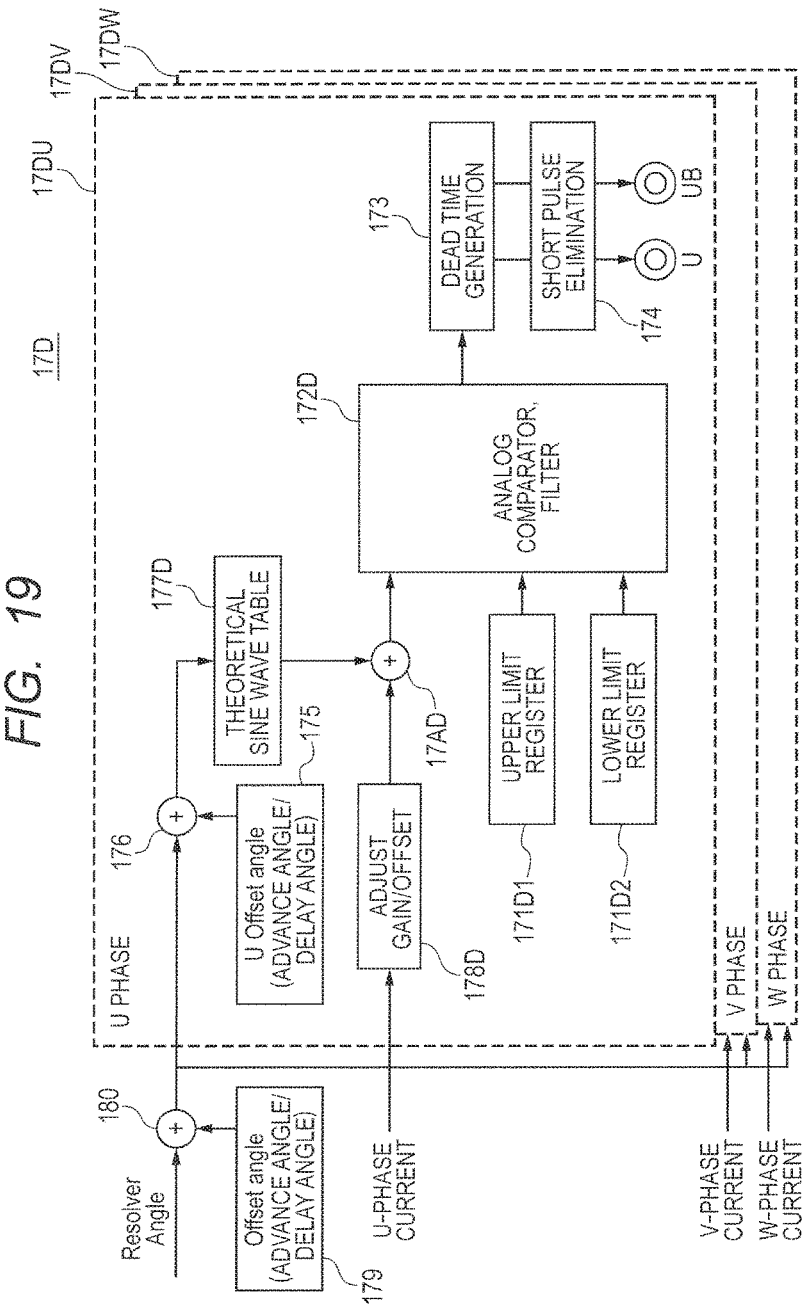
FIG. 19 is a block diagram of a square wave generation unit according to a fourth variation.
Figure 20:
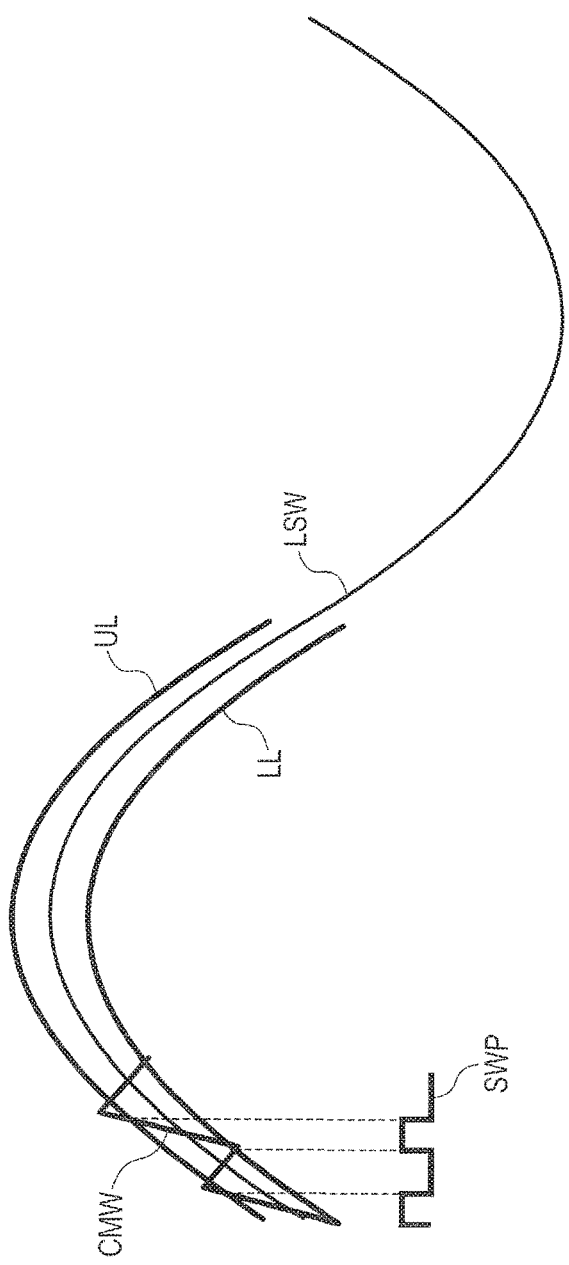
FIG. 20 is an image diagram for explaining a method of generating a square wave.

Next, a square wave generator circuit according to a fourth variation will be described with reference to FIGS. 19 and 20. FIG. 19 is a block diagram showing the square wave generator circuit according to the fourth variation. FIG. 20 is an image diagram for explaining a method of generating a square wave. Note that the waveform for one electrical angle is shown in FIG. 16. The fourth variation is to specify the position at which the pulse is inverted by a hysteresis control with a certain amount of hysteresis provided to the theoretical sine wave.

A square wave generator circuit 17D includes a U-phase square wave generator circuit 17DU, a V-phase square wave generator circuit 17DV, a W-phase square wave generator circuit 17DW, a register 179 for controlling the advance angle/delay angle with respect to all the three phases, and an adder 180 for adding the contents of the register to the angle of the resolver.

The U-phase square wave generator circuit 17DU includes: a compare upper limit register 171D1; a compare lower limit register 171D2; an analog comparator 172D including a filter, which is a comparison circuit; a dead time generator circuit 173; and a short pulse removing circuit 174. The U-phase square wave generator circuit 17DU further includes a register 175 for controlling the advance angle/delay angle for each phase, an adder 176 for adding the contents of the register to the angle of the resolver, a theoretical sine wave table 177D, a gain/offset adjustment circuit 178D, and a subtractor 17AD. The compare upper limit register 171D1 and the compare lower limit register 171D2 are memories readable and writable by the CPU 11. The theoretical sine wave table 177D is a memory readable and writable by the CPU 11. The gain/offset adjustment circuit 178D has a register readable and writable by the CPU 11.

The U-phase square wave generator circuit 17DU reads the theoretical sine wave table value corresponding to the angle (the advanced or delayed angle) of the resolver from the theoretical sine wave table 177D. Then, the subtractor 17AD calculates the deviation between the U-phase current value from the current detection circuit 13 and the theoretical sine wave table value, by subtracting the theoretical sine wave table value from the U-phase current value. The analog comparator 172D performs an analog comparison between the deviation and the value of the compare upper limit register 171D1, and between the deviation and the value of the compare lower limit register 171D2. The analog comparator 172D sets the square wave pulse (SWP) to Low when the deviation is positive and is greater than or equal to the value of the compare upper limit register 171D1, and sets the square wave pulse (SWP) to High when the deviation is negative and is greater or equal to the value of the compare lower limit register 171D2, so that the square wave pulse (SWP) is turned OFF/ON. In this way, it is possible to provide a certain amount of hysteresis in the theoretical sine wave, and to operate with the hysteresis control. The gain/offset adjustment circuit 178D adjusts the gain and offset of the U-phase current value and supplies to the subtractor 17AD. Note that although the embodiment calculates the ideal sine wave by performing the gain and offset adjustment, the fourth variation performs the gain and offset adjustment on the U-phase current value instead of adjusting the ideal sine wave. The gain adjustment value and the offset adjustment value are obtained in the adjustment process and stored in the memory 15. Note that the hysteresis control that provides a certain amount of hysteresis in the theoretical sine wave can also be operated within a predetermined angle range (for example, 30 degrees for the three phases).

The V-phase square wave generator circuit 17DV and the W-phase square wave generator circuit 17DW have the same configuration as the U-phase square wave generator circuit 17DU, but their square waves are generated so as to be shifted by 120 degrees with respect to each other.

The square wave can be adjusted by setting the compare upper limit register 171D1 and the compare lower limit register 171D2.

The fourth variation has more possibility to increase the number of pulses of the square wave than the embodiment but may approximate the square wave to the theoretical sine wave, so that efficiency may sometimes be increased.

According to the embodiment and the first to fourth variations, the software to output multiple pulses is no longer necessary and it is possible to improve (reduce) the software load.

In the comparative example, it is necessary to individually switch the U, V, W phases of the square wave output, with the timing controlled by the software without synchronization. When switching operations compete with each other, delay occurs in any of the three phases and the waveform is affected. However, the embodiment and the first to fourth variations can improve this problem. Further, in the comparative example, when the pulse width interval of the multiple pulses is small, the process by the software does not keep up and thus a desired output is not obtained. However, the embodiment and the first to fourth variations can improve this problem.

In the comparative example, when the number of pulses in the multi-pulse waveform is large, the load of the software is increased and the process may not catch up with the switching speed, and at worst, no output can be generated during one rotation of the electrical angle. Thus, in order to ensure safety, it is necessary to add a function to detect that the switching is missed and to add another software load. However, the embodiment and the first to fourth variations can improve this problem.

According to the embodiment and the first to forth variations, it is possible to calibrate the output patterns of different square wave pluses according to angle, speed, and temperature by using each of the three-phase motors.

While the invention made by the present inventors has been concretely described based on the embodiment and variations, the present invention is not limited to the above described embodiment and variations. It is apparent to those skilled in the art that various modifications and variations can be made without departing from the scope of the present invention.

For example, the embodiment and variations have described the case of using a three-phase motor. However, the present invention is not limited thereto, and can applicable to a two-phase motor or a multi-phase motor with four or more phases.

What is claimed is:

1. A semiconductor device comprising:
   a control circuit including a central processing unit (CPU) and a memory;
   a pulse width modulation (PWM) output circuit configured to control a driver integrated circuit (IC) that drives a power semiconductor device;
   a current detection circuit configured to detect a motor current; and
   an angle detection circuit configured to detect an angle of the motor,
   wherein the PMW output circuit includes a square wave generator circuit,
   wherein the square wave generator circuit generates a square wave based on an angle information of the angle detection circuit and a base square wave information, and
   wherein the control circuit is configured to:
   (a) generate a theoretical sine wave;
   (b) generate the base square wave information based on a deviation between a motor current measurement waveform and the theoretical sine wave;
   (c) adjust the base square wave information by changing a duty cycle of the base square wave information; and
   (d) adjust the base square wave information by changing a phase of the base square wave information.

2. The semiconductor device according to claim 1,
   wherein the square wave includes one or more square wave pulses, and
   wherein the square wave generator circuit comprises:
   a compare circuit that compares the angle information from the angle detection circuit with the angle information within a register that is set based on the base square wave information; and
   a waveform synthesis circuit that generates a rise and a fall of the square wave pulses based on a comparison result of the compare circuit.

3. The semiconductor device according to claim 2, wherein the memory stores the base square wave information.

4. The semiconductor device according to claim 1,
   wherein the square wave includes one or more square wave pulses,
   wherein the control circuit generates the base square wave information so as to minimize the deviation, and
   wherein a duty cycle and a phase of the square wave pulse are adjusted by the base square wave information.

5. The semiconductor device according to claim 1,
   wherein the control circuit is further configured to:
   (e) store the adjusted base square wave information into the memory.

6. The semiconductor device according to claim 5, wherein the control circuit is further configured to control a motor based on a vector information.

7. A semiconductor device comprising:
   a pulse width modulation (PWM) output circuit configured to control a driver integrated circuit (IC) that drives a power semiconductor device;
   a current detection circuit configured to detect a motor current; and
   an angle detection circuit configured to detect an angle of the motor,
   wherein the PWM output circuit comprises a square wave generator circuit,
   wherein the square wave generator circuit generates a square wave based on an angle information of the angle detection circuit as well as a theoretical sine wave, and
   wherein the square wave generator circuit further comprises an adjuster circuit configured to adjust a gain and an offset of current information from the current detection circuit.

8. The semiconductor device according to claim 7,
   wherein the square wave includes one or more square wave pulses, and
   wherein the square wave generator circuit comprises:
   a theoretical sine wave table configured to store a current information corresponding to the angle information from the angle detection circuit;
   a calculator configured to obtain a deviation between the current information from the current detection circuit and the current information of the theoretical sine wave table;
   an upper limit register configured to set an upper limit of the deviation;
   a lower limit register configured to set a lower limit of the deviation; and
   a comparison circuit that generates a rise and a fall of the square wave pulses based on a comparison result between the deviation and a contents of the upper limit register and on a comparison result between the deviation and a content of the lower limit register.

9. The semiconductor device according to claim 8,
   wherein the comparative circuit generates a fall of the square wave pulse upon the deviation is equal to or more than the content of the upper limit register and generates a rise of the square wave pulse upon the deviation is equal to or less than the content of the lower limit register.

10. A power conversion device comprising:
    a power semiconductor device configured to provide an alternating current (AC current) to a motor;
    a first semiconductor device configured to drive the power semiconductor device;
    a second semiconductor device configured to control the first semiconductor device;
    a current detector circuit configured to detect a current of the motor; and
    an angle detector circuit configured to detect an angle of the motor,
    wherein the second semiconductor device comprises:
    a control circuit including a central processing unit (CPU) and a memory;
    a pulse width modulation (PWM) output circuit configured to control the first semiconductor device;
    a current detection circuit configured to detect the current information from the current detector; and
    an angle detection circuit configured to detect the angle information from the angle detector,
    wherein the PWM output circuit comprises a square wave generator circuit, wherein the square wave generator circuit generates a square wave based on the angle information of the angle detection circuit and a base square wave information, and wherein the control circuit is configured to:
(a) generate a theoretical sine wave;
(b) generate the base square wave information based on a deviation between a motor current measurement waveform and the theoretical sine wave;
(c) adjust the base square wave information by changing a duty cycle of the base square wave information; and
(d) adjust the base square wave information by changing a phase of the base square wave information.

11. The power conversion device according to claim 10, wherein the square wave includes one or more square wave pulses, and
wherein the square wave generator circuit comprises:
a compare circuit that compares the angle information from the angle detection circuit with the angle information within a register that is set based on the base square wave information; and
a waveform synthesis circuit that generates a rise and a fall of the square wave pulses based on a comparison result of the compare circuit.

12. The power conversion device according to claim 11, wherein the memory stores the base square wave information.

13. The power conversion device according to claim 10, wherein the square wave includes one or more square wave pulses,
wherein the control circuit generates the base square wave information so as to minimize the deviation, and
wherein a duty cycle and a phase of the square wave pulses are adjusted by the base square wave information.

14. The power conversion device according to claim 10, wherein the control circuit is further configured to:
(e) store the adjusted base square wave information into the memory.

15. The power conversion device according to claim 14, wherein the control circuit is further configured to control a motor based on a vector information.

* * * * *